(12) United States Patent
Shi et al.

(10) Patent No.: US 12,377,447 B2
(45) Date of Patent: Aug. 5, 2025

(54) METHOD FOR CLEANING PARTICULATE CONTAMINANT

(71) Applicant: Sichuan Soarinno Technology Co., Ltd., Chengdu (CN)

(72) Inventors: Jiying Shi, Chengdu (CN); Xunyu Mao, Chengdu (CN)

(73) Assignee: Sichuan Soarinno Technology Co., Ltd., Chengdu (CN)

( * ) Notice: Subject to any disclaimer, the term of this patent is extended or adjusted under 35 U.S.C. 154(b) by 0 days.

(21) Appl. No.: 18/284,566

(22) PCT Filed: Jun. 15, 2023

(86) PCT No.: PCT/CN2023/100348
§ 371 (c)(1),
(2) Date: Sep. 28, 2023

(87) PCT Pub. No.: WO2023/208255
PCT Pub. Date: Nov. 2, 2023

(65) Prior Publication Data
US 2025/0083198 A1    Mar. 13, 2025

(30) Foreign Application Priority Data
Apr. 26, 2022   (CN) .......................... 202210449342.6

(51) Int. Cl.
*B08B 7/00*    (2006.01)
*B08B 5/02*    (2006.01)
(Continued)

(52) U.S. Cl.
CPC .............. *B08B 7/0021* (2013.01); *B08B 5/02* (2013.01); *B08B 5/04* (2013.01); *H01L 21/02101* (2013.01)

(58) Field of Classification Search
None
See application file for complete search history.

(56) References Cited

U.S. PATENT DOCUMENTS 5,294,261 A * 3/1994 McDermott ...... H01L 21/67028
134/7

FOREIGN PATENT DOCUMENTS

CN    101740344 A    6/2010
CN    110491770 A    11/2019
(Continued)

OTHER PUBLICATIONS

Google Patents translation of CN217222765U (Year: 2025).*

*Primary Examiner* — Eric W Golightly
(74) *Attorney, Agent, or Firm* — Laine IP Oy

(57) ABSTRACT

A method for cleaning particulate contaminants is provided and it relates to the technical field of cleaning methods. The method comprises spraying the nitrogen-argon supercritical mixed fluid on the to-be-cleaned workpiece, wherein the nitrogen-argon supercritical mixed fluid has a temperature of $-120°$ C. to $-90°$ C. and a pressure of 4 to 5 MPa, the mass fraction of nitrogen is 50-80%. A Laval nozzle is employed to spray and an inert gas is introduced into the cleaning chamber and vented to displace the gas in the cleaning chamber before cleaning. The nitrogen-argon supercritical mixed fluid is sprayed at a speed of 400-650 m/s; an angle between the sprayed nitrogen-argon supercritical mixed fluid and the horizontal plane where the to-be-cleaned workpiece is located is preferably 30° to 50°. Nitrogen was used as the blowing gas to blow the top of the to-be-cleaned workpiece and remove the contaminants on the to-be-cleaned workpiece.

9 Claims, 1 Drawing Sheet

(51) Int. Cl.
 *B08B 5/04* (2006.01)
 *H01L 21/02* (2006.01)

(56) References Cited

FOREIGN PATENT DOCUMENTS

| | | | | |
|---|---|---|---|---|
| CN | 111974752 | A | | 11/2020 |
| CN | 114078692 | A | | 2/2022 |
| CN | 114798602 | A | | 7/2022 |
| CN | 217222765 | U * | 8/2022 | ............. B08B 13/00 |
| JP | H06295895 | A | | 10/1994 |

\* cited by examiner

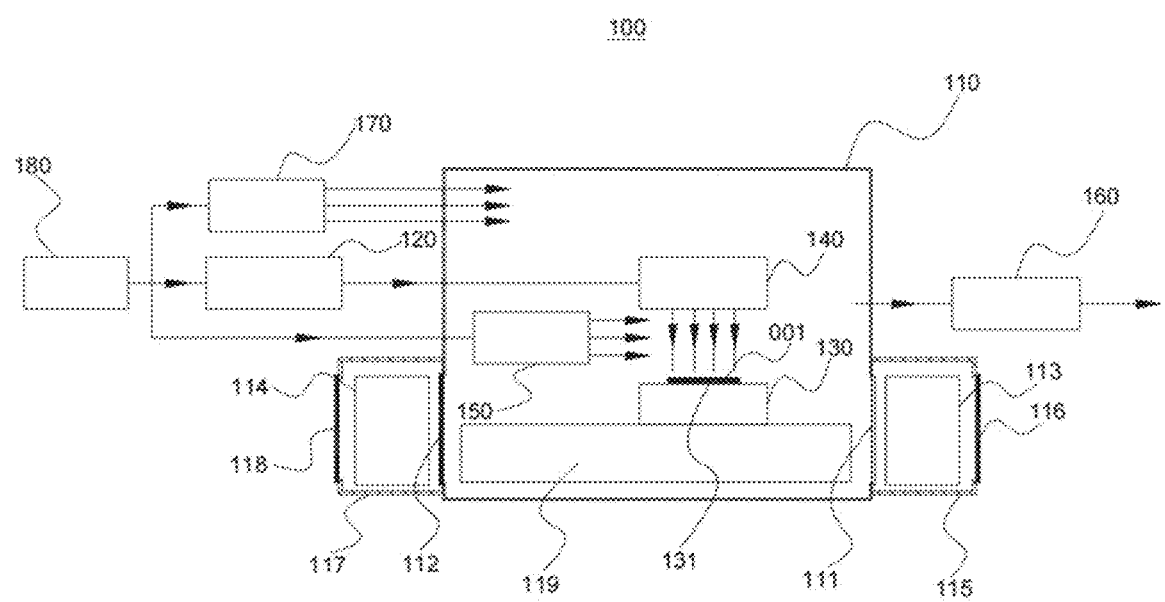

METHOD FOR CLEANING PARTICULATE CONTAMINANT

CROSS-REFERENCE TO RELATED APPLICATIONS

The present disclosure claims the priority to the Chinese patent application with the filing No. CN202210449342.6 filed with the Chinese Patent Office on Apr. 26, 2022, and entitled "Method for Cleaning Particulate Contaminant", the contents of which are incorporated herein by reference in entirety.

TECHNICAL FIELD

The present disclosure relates to the technical field of cleaning methods, in particular to a cleaning method for particulate contaminant (particle contaminant).

BACKGROUND ART

In the field of optoelectronic information technology and precision machinery manufacturing, the requirements for manufacturing accuracy are getting higher and higher with the further development of manufacturing technology in the industry. The highest processing accuracy reaches the scale of a sub-micrometer or nanometer. More and more attention is being paid to the control for contaminants on the surface of processed devices along with the increase in processing accuracy. The residual particulate contaminants on the surface will impact the surface quality of the processed product, and the optical and electronic properties of the product. In serious cases, the product will even be scrapped. In the precision processing of semiconductor devices and optical devices, the control for residual contaminants on the surface is usually required to reach to the scale of a micrometer or sub-micrometer. The standard latest issued by the International Organization for Standardization (ISO) also extends the controllable range of surface particle residues down to the scale of sub-micrometer and nanometer. It is sufficient to show that more attention is paid to the strict control for ultrafine particulate contaminants in modern industrial production and scientific research.

The particulate contaminants will be generated inevitably during production and processing of semiconductor devices, optical lenses, metal devices, and other devices. The removal of residual particulate contaminants from the surface is an extremely important procedure after production and processing. At present, there are many methods to remove residual particulate contaminants on the surface in the precision manufacturing industry, such as cleaning by spraying and wiping, ultrasonic cleaning, cleaning by high-pressure spray, cleaning by chemical reagent, blowing by air knife, and laser cleaning, which are all highly effective cleaning methods. However, regarding particulate contaminants of micrometer and sub-micrometer level, it is more difficult to clean due to the relatively large electrostatic attraction and van der Waals force between particles and surface molecules. Generally, the megasonic cleaning method and carbon-dioxide cleaning method are used to clean these particulate contaminants. The megasonic cleaning method belongs to wet cleaning and the carbon-dioxide cleaning method belongs to dry cleaning. Most optical lenses, metal devices, and so on are suitable for wet cleaning. However, a few optical lenses, semiconductor devices and metal devices made of special materials are not suitable for wet cleaning, and thus the dry cleaning is required.

The carbon-dioxide cleaning method, a newly emerging technique of dry cleaning, utilizes a Venturi tube as its core component. High-pressure carbon dioxide gas passes through the Venturi tube, and then the state of matter is changed to form a mixture of solid, liquid, and gas. When solid carbon dioxide particles reach the surface of the workpiece, they undergo instantaneous sublimation due to a sudden increase in temperature, resulting in micro-explosions in localized areas, which generate significant impact forces in the tiny areas where the explosions occur, which peel off and remove particulate contaminants adhered to the surface of the workpiece. Currently, carbon-dioxide cleaning method has been widely used abroad. However, its effectiveness in removing contaminants is not high, and as a solvent, the carbon dioxide can dissolve device coatings, thereby limiting its applicability.

SUMMARY

The objective of the present disclosure is to provide a cleaning method for particulate contaminants, aiming to thoroughly remove particulate contaminants from the surface of the to-be-cleaned workpiece without damaging the coating on the surface of the workpiece.

The present disclosure provides a method for cleaning particulate contaminants, comprising spraying the nitrogen-argon supercritical mixed fluid on the to-be-cleaned workpiece, wherein the nitrogen-argon supercritical mixed fluid has a temperature of $-120°$ C. to $-90°$ C. and a pressure of 4 to 5 MPa.

Optionally, in the nitrogen-argon supercritical mixed fluid, the mass fraction of nitrogen is 50-80%, optionally 60-70%.

Optionally, the cleaning duration is 20-30 s.

Optionally, the nitrogen-argon supercritical mixed fluid has a temperature of $-110°$ C. to $-100°$ C. and a pressure of 4.3 to 4.8 MPa.

Optionally, a Laval nozzle is employed to spray the nitrogen-argon supercritical mixed fluid.

Optionally, the spacing between the to-be-cleaned workpiece and the Laval nozzle is 0.5 to 2 cm.

Optionally, the nitrogen-argon supercritical mixed fluid is sprayed at a speed of 400 to 650 m/s; an angle between the sprayed nitrogen-argon supercritical mixed fluid and the horizontal plane where the to-be-cleaned workpiece is located is $10°$ to $80°$.

Optionally, the cleaning process is carried out within a sealed cleaning chamber, where the to-be-cleaned workpiece is placed on a placement platform inside the cleaning chamber. The Laval nozzle is located above the placement platform, and the placement platform is provided with a heating device to heat the area beneath the to-be-cleaned workpiece, such that the temperature below the to-be-cleaned workpiece is higher than the temperature over the to-be-cleaned workpiece, thereby creating a thermophoresis effect.

Optionally, the heating device has an operating temperature of 10 to $30°$ C.

Optionally, during the cleaning process, the pressure inside the cleaning chamber is controlled to be negative pressure; and optionally, the pressure inside the cleaning chamber is controlled to be $-73.3$ kPa to $-100$ Pa.

Optionally, before cleaning, an inert gas is introduced into the cleaning chamber and vented to displace the gas in the cleaning chamber; and optionally, the inert gas is at least one selected from nitrogen and argon.

Optionally, during the cleaning process, the top of the to-be-cleaned workpiece is blown, to carry away contaminants from the to-be-cleaned workpiece.

Optionally, a laminar gas is generated above the to-be-cleaned workpiece for blowing, and the gas is then expelled through a vacuum system.

Optionally, the raw material used to be the blowing gas is at least one selected from nitrogen and argon.

Optionally, the to-be-cleaned workpiece is at least one selected from the semiconductor devices, optical lenses, and metal devices; optionally, semiconductor devices; more optionally, silicon wafers.

The present disclosure has the following beneficial effects. By utilizing a nitrogen-argon supercritical mixed fluid for cleaning the surface of the to-be-cleaned workpiece, and controlling the temperature and pressure of the nitrogen-argon supercritical mixed fluid, compared to conventional supercritical fluid such as carbon dioxide, it can significantly enhance the cleaning effectiveness against particulate contaminants on the workpiece surface without impacting the coating on the workpiece surface.

BRIEF DESCRIPTION OF DRAWINGS

In order to more clearly illustrate the technical solutions of the embodiments of the present disclosure, the following will briefly introduce the drawings used in the embodiments. It should be understood that the following drawings only show some embodiments of the present disclosure, and therefore should not be regarded as a limitation on the scope. Those ordinary skilled in the art can also obtain other related drawings based on these drawings without inventive effort.

FIG. 1 is a structural schematic view of the cleaning device provided in the embodiment of the present disclosure.

Reference numerals: 100—cleaning device; 001—to-be-cleaned workpiece; 110—cleaning chamber; 120—supercritical fluid generating system; 130—placement platform; 131—heating device; 140—jetting mechanism; 150—blowing gas generating system; 160—vacuum system; 170—gas displacement system; 180—gas supply system; 111—first feeding sealing door; 112—first discharge sealing door; 113—first transport box; 114—second transport box; 115—feeding chamber; 116—second feeding sealing door; 117—discharge chamber; 118—second discharge sealing door; 119—transport mechanism.

DETAILED DESCRIPTION OF EMBODIMENTS

To provide a clearer understanding of the objective, technical solution, and advantages of embodiments of the present disclosure, the technical solution in the embodiments of the present disclosure will be described in a clear and comprehensive manner. If specific conditions are not specified in the embodiments, the embodiments follow standard conditions or the conditions recommended by the manufacturer. If the manufacturer of the reagents or instruments used is not specified, they are regular products that can be obtained through commercially available purchases.

The embodiment of the present disclosure provides a method for cleaning particulate contaminants, comprising spraying the nitrogen-argon supercritical mixed fluid on the to-be-cleaned workpiece, wherein the nitrogen-argon supercritical mixed fluid has a temperature of −120° C. to −90° C. and a pressure of 4 to 5 MPa.

It should be noted that traditional cleaning methods that utilize carbon dioxide supercritical fluid as cleaning agent can easily cause damage to the surface coatings of the workpieces. Additionally, these methods are not highly effective in removing particulate contaminants. The inventors creatively employ a nitrogen-argon supercritical mixed fluid as a cleaning agent. Due to the excellent stability of $N_2$ and Ar, this fluid removes contaminants from the surface of the workpieces without causing damage to the coatings. Furthermore, it does not result in environmental pollution. More importantly, the nitrogen-argon supercritical mixed fluid significantly improves the cleaning efficiency for particulate contaminants on the surface of the workpieces compared to traditional supercritical fluids.

Specifically, the temperature of the nitrogen-argon supercritical mixed fluid can be −120° C., −115° C., −110° C., −105° C., −100° C., −95° C., −90° C., or any value between these adjacent temperature values; and the pressure of the nitrogen-argon supercritical mixed fluid can be 4.0 MPa, 4.1 MPa, 4.2 MPa, 4.3 MPa, 4.4 MPa, 4.5 MPa, 4.6 MPa, 4.7 MPa, 4.8 MPa, 4.9 MPa, 5.0 MPa, or any value between these adjacent pressure values. In the optional embodiments, the nitrogen-argon supercritical mixed fluid has a temperature of −110° C. to −100° C. and a pressure of 4.3 to 4.8 MPa.

Optionally, in the nitrogen-argon supercritical mixed fluid, the mass fraction of nitrogen is 50-80%, and optionally 60-70%. Controlling the mass fraction of the nitrogen within the above-mentioned range is benefit to improving the cleaning effectiveness on the surface of the workpieces. Specifically, the mass fraction can be 50%, 55%, 60%, 65%, 70%, 75%, 80%, or any value between these adjacent content values. A cleaning duration of 20-30 s can ensure the cleaning effect for particulate contaminants on the surface of the workpieces.

It should be noted that existing devices can be used to generate the nitrogen-argon supercritical mixed fluid, with the only need to control the parameters to make the prepared mixed fluid meet the requirements on nitrogen content, temperature, pressure, and other factors. The nitrogen-argon supercritical mixed fluid shares the advantages of traditional supercritical fluids, such as liquid-like density, gas-like viscosity, high diffusion coefficient, and low viscosity.

In some embodiments, a Laval nozzle is employed to spray the nitrogen-argon supercritical mixed fluid. The distance between the Laval nozzle and the to-be-cleaned workpiece is set at 0.5-2 cm. The nitrogen-argon supercritical mixed fluid is sprayed at a speed of 400 to 650 m/s; and an angle between the sprayed nitrogen-argon supercritical mixed fluid and the horizontal plane of the to-be-cleaned workpiece is 10° to 80°. Controlling the operational parameters of the Laval nozzle contributes to enhancing the cleaning effectiveness for the workpieces.

Specifically, the Laval nozzle is of an existing nozzle structure that can supersonically eject a matter to obtain a mixture of gas, liquid, and solid. When solid particles reach the surface of the workpiece, they undergo instantaneous sublimation due to the sudden increase in temperature, resulting in micro-explosions in small areas, which generate significant impact forces in the tiny areas where the explosions occur, which peel off and remove particulate (micro-scale, sub-micro-scale, nano-scale) contaminants adhered to the surface of the workpiece.

In certain embodiments, the cleaning process is carried out within a sealed cleaning chamber, where the to-be-cleaned workpiece is placed on a placement platform inside the cleaning chamber. The Laval nozzle is located above the placement platform, and the placement platform is provided with a heating device to heat the area beneath the to-becleaned workpiece, such that the temperature below the to-be-cleaned workpiece is higher than the temperature over the to-be-cleaned workpiece, thereby generating thermophoresis effect. In this way, the dislodged particles move upwardly so as to reduce the possibility of secondary contamination. In practical operation, the working temperature of the heating device can be 10 to 30° C.

Optionally, during the cleaning process, the pressure inside the cleaning chamber is controlled to be negative pressure. Optionally, the pressure inside the cleaning chamber is controlled to be −73.3 kPa to −100 Pa, thereby increasing the kinetic energy of the substances ejected from the nozzle and making it easier to peel off contaminants from the workpiece surface.

To avoid the influence of external gases on the workpiece, inert gas is introduced into the cleaning chamber before cleaning and then discharged to replace the gas inside the cleaning chamber. Specifically, the inert gas is at least one selected from nitrogen and argon, which can be nitrogen or argon alone or mixed gas of the two. In other embodiments, the inert gas is not limited to nitrogen and argon.

To further enhance the cleaning effect, during the cleaning process, the top of the to-be-cleaned workpiece is blown, to carry away contaminants from the to-be-cleaned workpiece. Optionally, a laminar gas is generated above the to-be-cleaned workpiece for blowing, and the gas is then expelled through a vacuum system. Using laminar gas for blowing makes it easier to remove contaminants from the workpiece.

Specifically, existing devices can be used to generate the laminar gas, and the raw material for generating the blowing gas is at least one selected from nitrogen and argon, which can be nitrogen or argon alone or mixed gas of the two.

Optionally, the to-be-cleaned workpiece is at least one selected from semiconductor devices, optical lenses, and metal devices; optionally, semiconductor devices; and optionally, silicon wafers. The cleaning method provided by the embodiments of the present disclosure is suitable for cleaning semiconductor devices, optical lenses, and metal devices. Silicon wafers, the most common devices that require precision machining, is highly suitable for being cleaned by the cleaning method provided by the embodiment of the present disclosure.

The equipment used to implement the cleaning method provided by the embodiments of the present disclosure is not limited. To facilitate a better understanding of the cleaning method provided by the embodiment of the present disclosure, a cleaning device capable of implementing the cleaning method provided in the embodiment of the present disclosure is described as follows.

Referring to FIG. 1, the embodiment of the present disclosure provides a cleaning device 100 for cleaning particulate contaminants, comprising a cleaning chamber 110 and a supercritical fluid generating system 120 used to generate supercritical fluid. The to-be-cleaned workpiece 001 inside the cleaning chamber 110 is cleaned by the supercritical fluid generated from the supercritical fluid generating system 120.

Specifically, the cleaning chamber 110 is the main space for the cleaning process and is preferably isolated from the external environment to maintain internal parameters such as temperature and pressure during the cleaning process.

Specifically, the cleaning chamber 110 is provided therein with a placement platform 130 for placing the to-be-cleaned workpiece 001 and a jetting mechanism 140 for jetting the supercritical fluid. The feeding end of the supercritical fluid generating system 120 is communicated with a pipeline for delivering the nitrogen-argon mixture material, and the discharge end of the supercritical fluid generating system 120 is communicated with the feeding end of the jetting mechanism 140. The nozzle of the jetting mechanism 140 is facing directly the placement platform 130. Nitrogen (or liquid nitrogen) and argon are delivered using a nitrogen-argon mixture material; and the supercritical fluid generating system 120 utilizes the nitrogen-argon mixture material to generate nitrogen-argon mixed supercritical fluid for cleaning the to-be-cleaned workpiece 001.

Specifically, the supercritical fluid generating system 120 is an existing device used to generate supercritical fluid, and the supercritical fluid possesses advantages such as density close to that of a liquid, viscosity close to that of a gas, high diffusion coefficient, and low viscosity.

In some embodiments, the jetting mechanism 140 comprises a Laval nozzle, and the distance between the outlet of the Laval nozzle and the placement platform 130 is 0.5-2 cm. The angle and distance of the Laval nozzle can be adjusted as needed.

In some embodiments, a drive mechanism (not shown in the FIGURE) is also included to drive the placement platform 130 to move, thereby allowing comprehensive cleaning for the to-be-cleaned workpiece 001 by moving the placement platform 130. Specifically, the specific structure of the drive mechanism is not limited and can be a general motor or other driving components.

In some embodiments, the placement platform 130 is provided with a heating mechanism (not shown in the FIGURE) for heating the lower part of the to-be-cleaned workpiece 001 on the placement platform 130, which causes the lower part of the to-be-cleaned workpiece 001 to have a higher temperature than the upper part, thereby creating a thermophoresis effect, so as to facilitate the upward movement of dislodged particles and reduce the possibility of secondary contamination. Specifically, the heating mechanism can be a general electric heating structure, as long as it is capable of heating the lower part of the to-be-cleaned workpiece 001.

To enhance the cleaning effect, a blowing gas generating system 150 is mounted inside the cleaning chamber 110 to generate blowing gas. The discharge end of the blowing gas generating system 150 is located above the placement platform 130 to blow the surface of the to-be-cleaned workpiece 001 by generating the blowing gas through the blowing gas generating system 150. The blowing gas, which can be nitrogen or argon, can be sprayed through the blowing gas generating system 150 in a direction parallel to the surface of the to-be-cleaned workpiece 001 for blowing, thereby carrying away dislodged contaminants.

In some embodiments, the blowing gas generating system 150 can be of a general nozzle structure, as long as it is capable of spraying blowing gas. The specific structure is not limited excessively.

In alternative embodiments, the blowing gas generating system 150 can be a device that generates laminar gas to enhance the blowing effect.

In some embodiments, a vacuum system 160 is connected to the cleaning chamber 110 to extract the gas inside the cleaning chamber 110. The vacuum system 160 can maintain a negative pressure state of the cleaning chamber 110 during the cleaning process, thereby enabling substances ejected from the nozzle to have greater kinetic energy, which facilitates the detachment of contaminants from the workpiece surface. Moreover, the vacuum system 160 can also evacuate the blowing gas generated by the blowing gas generating system 150. Specifically, the vacuum system 160 can be positioned on a side away from the blowing gas generating system 150, thereby allowing the blowing gas to pass over the surface of the to-be-cleaned workpiece 001 before being expelled by the vacuum system 160.

In some embodiments, the cleaning device 100 also comprises a gas displacement system 170 for replacing the gas inside the cleaning chamber 110 before the cleaning process. The discharge end of gas displacement system 170 is communicated with the cleaning chamber 110. Before the cleaning process, the gas displacement system 170 introduces nitrogen or argon into the left end of the cleaning chamber 110. The vacuum system 160 at the right end of the cleaning chamber 110 exhausts the gas along with particle impurities. The inert gas used to displace the gas in the cleaning chamber 110 ensures a clean chamber environment, and the inert gas will not react with the workpiece.

Specifically, the gas displacement system 170 can be a pipeline used for transporting gases. The specific structure is not limited.

In some embodiments, the cleaning device 100 also comprises a gas supply system 180. The discharge end of the gas supply system 180 communicates respectively with the gas inlets of the supercritical fluid generating system 120, the blowing gas generating system 150, and the gas displacement system 170, which is used to supply gases to the supercritical fluid generating system 120, blowing gas generating system 150, and gas displacement system 170, thereby providing high-purity liquid nitrogen, liquid argon, nitrogen, argon, or other raw materials for these three systems.

In other embodiments, the supercritical fluid generating system 120, blowing gas generating system 150, and gas displacement system 170 is able to not share a common gas supply system 180. Instead, they can each have their own gas supply unit, thereby allowing for flexible selection of gases for each system.

To facilitate the transfer of the to-be-cleaned workpiece 001, a first feeding sealing door 111 is provided on one side of the cleaning chamber 110, while a first discharge sealing door 112 is arranged on the opposite side. Outside the cleaning chamber 110, a first transport box 113 is provided to load the uncleaned workpieces at the corresponding position of the first feeding sealing door 111. Outside the cleaning chamber 110, a second transport box 114 is provided to hold the cleaned workpieces at the corresponding position of the first discharge sealing door 112. The uncleaned workpieces inside the first transport box 113 are transferred through the first feeding sealing door 111 onto the placement platform 130 for cleaning. After the cleaning process, the cleaned workpieces are transferred through the first discharge sealing door 112 to the second transport box 114 for storage.

To prevent contamination of the workpiece by the external environment, the outer wall of the cleaning chamber 110 is provided with a feeding chamber 115, which is used to block the first feeding sealing door 111. The first transport box 113 is located inside the feeding chamber 115. The feeding chamber 115 is thereon provided with a second feeding sealing door 116, which is opposite to the first feeding sealing door 111. Further, the outer wall of the cleaning chamber 110 is provided with a discharge chamber 117, which is used to block the first discharge sealing door 112. The second transport box 114 is located inside the discharge chamber 117. The discharge chamber 117 is thereon provided with a second discharge sealing door 118, which is opposite to the first discharge sealing door 112. The feeding chamber 115 and the discharge chamber 117 allows for the isolation of the workpiece from the external environment and the cleaning chamber 110, thereby avoiding contamination of the workpiece by the external environment.

During the actual operation, the feeding chamber 115 and the discharge chamber 117 can also provide gas by using the gas supply system 180 and replace the gas in the internal space, thereby avoiding impact on the workpiece. Additionally, before cleaning and after cleaning, during the transfer of the silicon wafers, the gas displacement system 170 can be used to balance the pressure in the discharge chamber 117, feeding chamber 115, and cleaning chamber 110.

In some embodiments, the cleaning device 100 also comprises a transport mechanism 119 for transporting the workpiece between the first transport box 113, the placement platform 130, and the second transport box 114. The transport mechanism 119 can be of a general mechanical arm structure, as long as it is capable of transferring the workpiece.

Specifically, the first feeding sealing door 111, the first discharge sealing door 112, the second feeding sealing door 116, and the second discharge sealing door 118 can be existing door structures that are electrically controlled. By opening or closing operation outside the cleaning chamber 110, it remains sealed to the housing of the cleaning chamber 110 when closed.

During the actual operation, the feeding chamber 115 is used to place the first transport box 113. After placing the first transport box 113 into the feeding chamber 115, the second feeding sealing door 116 is closed, and clean gas is introduced into the feeding chamber 115. When the transport mechanism 119 takes out the cleaned workpiece, the first feeding sealing door 111 opens; after taking out, the first feeding sealing door 111 closes. When taking out the first transport box 113, the second feeding sealing door 116 opens. After taking out the first transport box 113, the second feeding sealing door 116 closes and clean gas is introduced for replacement. The above method reduces contamination for the cleaning chamber 110 and the feeding chamber 115 by the external environment.

During the actual operation, the discharge chamber 117 is used to place the second transport box 114. After placing the second transport box 114 into the discharge chamber 117, the second discharge sealing door 118 is closed, and clean gas is introduced into the discharge chamber 117 to replace the contaminated gas from the external environment. When the transport mechanism 119 places the cleaned workpiece into the second transport box 114, the first discharge sealing door 112 opens; after placement, the first discharge sealing door 112 closes. When taking out the second transport box 114, the second discharge sealing door 118 opens; after taking out, the second discharge sealing door 118 closes, and clean gas is introduced for replacement. The above method can reduce contamination for the cleaning chamber 110 and the discharge chamber 117 by the external environment.

The features and performance of the present disclosure are described below in further detail in combination with examples.

It should be noted that the following embodiments can be implemented using the device shown in FIG. 1, but are not limited to the device shown in FIG. 1. The size of the particulate contaminants (silicon dioxide) on the to-be-cleaned workpiece in the following embodiments is approximately 30 nm.

Example 1

The embodiment provided a method for cleaning particulate contaminants, comprising the following steps:

placing the to-be-cleaned workpiece (silicon wafer) on the placement platform inside the cleaning chamber, with the Laval nozzle positioned above the placement platform, wherein the placement platform was provided with a heating device to heat the area beneath the to-be-cleaned workpiece, with a controlled heating temperature of 20° C.; and the distance between the to-be-cleaned workpiece and the Laval nozzle was 0.5 cm;

before cleaning, introducing nitrogen into the cleaning chamber to replace the gas inside the cleaning chamber; and during the cleaning process, using the Laval nozzle to spray a nitrogen-argon supercritical mixed fluid onto the to-be-cleaned workpiece, wherein the nitrogen mass fraction in the nitrogen-argon supercritical mixed fluid was controlled at 50%, the temperature of the nitrogen-argon supercritical mixed fluid was −110° C., and the pressure was 4.5 MPa; the speed at which the nitrogen-argon supercritical mixed fluid was sprayed was 500 m/s, and the angle between the sprayed nitrogen-argon supercritical mixed fluid and the horizontal plane of the to-be-cleaned workpiece was 30°; the pressure inside the cleaning chamber was controlled at −1 kPa during cleaning process; and nitrogen was used as the blowing gas to blow the top of the to-be-cleaned workpiece and remove the contaminants on the to-be-cleaned workpiece.

The results show that the removal rate of particle contaminants on the workpiece surface is greater than 97.4%.

Example 2

The embodiment provided a method for cleaning particulate contaminants, comprising the following steps:
placing the to-be-cleaned workpiece (silicon wafer) on the placement platform inside the cleaning chamber, with the Laval nozzle positioned above the placement platform, wherein the placement platform was provided with a heating device to heat the area beneath the to-be-cleaned workpiece, with a controlled heating temperature of 25° C.; and the distance between the to-be-cleaned workpiece and the Laval nozzle was 1 cm;

before cleaning, introducing nitrogen into the cleaning chamber to replace the gas inside the cleaning chamber; and during the cleaning process, using the Laval nozzle to spray a nitrogen-argon supercritical mixed fluid onto the to-be-cleaned workpiece, wherein the nitrogen mass fraction in the nitrogen-argon supercritical mixed fluid was controlled at 80%, the temperature of the nitrogen-argon supercritical mixed fluid was −120° C., and the pressure was 4 MPa; the speed at which the nitrogen-argon supercritical mixed fluid was sprayed was 400 m/s, and the angle between the sprayed nitrogen-argon supercritical mixed fluid and the horizontal plane of the to-be-cleaned workpiece was 30°; the pressure inside the cleaning chamber was controlled at −40 kPa during the cleaning process; and nitrogen was used as the blowing gas to blow the top of the to-be-cleaned workpiece and remove the contaminants on the to-be-cleaned workpiece.

The results show that the removal rate of particle contaminants on the workpiece surface is 96.2%.

Example 3

The embodiment provided a method for cleaning particulate contaminants, comprising the following steps:
placing the to-be-cleaned workpiece (silicon wafer) on the placement platform inside the cleaning chamber, with the Laval nozzle positioned above the placement platform, wherein the placement platform was provided with a heating device to heat the area beneath the to-be-cleaned workpiece, with a controlled heating temperature of 30° C.; and the distance between the to-be-cleaned workpiece and the Laval nozzle was 1.5 cm;

before cleaning, introducing nitrogen into the cleaning chamber to replace the gas inside the cleaning chamber; and during the cleaning process, using the Laval nozzle to spray a nitrogen-argon supercritical mixed fluid onto the to-be-cleaned workpiece, wherein the nitrogen mass fraction in the nitrogen-argon supercritical mixed fluid was controlled at 60%, the temperature of the nitrogen-argon supercritical mixed fluid was −90° C., and the pressure was 5 MPa; the speed at which the nitrogen-argon supercritical mixed fluid was sprayed was 600 m/s, and the angle between the sprayed nitrogen-argon supercritical mixed fluid and the horizontal plane of the to-be-cleaned workpiece was 45°; the pressure inside the cleaning chamber was controlled at −60 kPa during the cleaning process; and nitrogen was used as the blowing gas to blow the top of the to-be-cleaned workpiece and remove the contaminants on the to-be-cleaned workpiece.

The results show that the removal rate of particle contaminants on the workpiece surface is 98.1%.

Comparative Example 1

The difference from Example 1 was only that conventional nitrogen was used to replace the nitrogen-argon supercritical mixed fluid in the Example 1.

The results show that the particle contaminants on the workpiece surface cannot be removed, that is, the contaminant content remains the same before and after cleaning.

Comparative Example 2

The difference from Example 1 was only that a single nitrogen supercritical fluid was used to replace the nitrogen-argon supercritical mixed fluid in the Example 1.

The results show that the removal rate of particle contaminants on the workpiece surface is 41.7%.

Comparative Example 3

The difference from Example 1 was only that a single argon supercritical fluid was used to replace the nitrogen-argon supercritical mixed fluid in the Example 1.

The results show that the removal rate of particle contaminants on the workpiece surface is 32.3%.

Comparative Example 4

The difference from Example 1 was only that a carbon dioxide supercritical fluid was used to replace the nitrogen-argon supercritical mixed fluid in the Example 1.

The results show that the removal rate of particle contaminants on the workpiece surface is 76.5%.

Comparative Example 5

The difference from Example 1 was only that the nitrogen mass fraction in the nitrogen-argon supercritical mixed fluid was 40%.

The results show that the removal rate of particle contaminants on the workpiece surface is 53.8%.

Comparative Example 6

The difference from Example 1 was only that the nitrogen mass fraction in the nitrogen-argon supercritical mixed fluid is 90%.

The results show that the removal rate of particle contaminants on the workpiece surface is 48.6%.

In summary, the present disclosure provides a method for cleaning particulate contaminants, which uses the nitrogen-argon supercritical mixed fluid to clean the surface of to-be-cleaned workpiece. By controlling the temperature and pressure of the nitrogen-argon supercritical mixed fluid, the method offers the following advantages.

(1) Compared to conventional supercritical fluid such as carbon dioxide, the cleaning effectiveness against particulate contaminants on the workpiece surface can be significantly enhanced, without affecting the coating on the workpiece surface.

(2) After peeling off the contaminants, the lower part of the to-be-cleaned workpiece is heated to create a thermophoresis effect, which causes the contaminants to move upward, thereby reducing the reattachment of contaminants to the workpiece.

(3) The blowing gas is used to carry away the contaminants peeled off from the workpiece, which are discharged from the chamber through the vacuum system.

The above is only optional embodiment of the present disclosure, which is not intended to limit the present disclosure, and the present disclosure may have various changes and variations for those skilled in the art. Any modification, equivalent substitution, improvement, etc. made within the spirit and principles of the present disclosure shall be included in the scope of protection of the present disclosure.

What is claimed is:

1. A method for cleaning particulate contaminants, comprising spraying a nitrogen-argon supercritical mixed fluid on a to-be-cleaned workpiece, wherein the nitrogen-argon supercritical mixed fluid has a temperature of −120° C. to −90° C. and a pressure of 4 to 5 Mpa;

wherein a Laval nozzle is employed to spray the nitrogen-argon supercritical mixed fluid; and wherein a cleaning process is carried out within a sealed cleaning chamber, wherein the to-be-cleaned workpiece is placed on a placement platform inside the cleaning chamber, the Laval nozzle is located above the placement platform, and the placement platform is provided with a heating device to heat an area beneath the to-be-cleaned workpiece, such that a temperature below the to-be-cleaned workpiece is higher than a temperature over the to-be-cleaned workpiece, thereby creating a thermophoresis effect.

2. The method according to claim 1, wherein during the cleaning process, a pressure inside the cleaning chamber is controlled to be negative pressure.

3. The method according to claim 1, wherein an inert gas is introduced into the cleaning chamber before cleaning and then discharged to replace a gas inside the cleaning chamber.

4. The method according to claim 3, wherein during the cleaning process, a top of the to-be-cleaned workpiece is blown, to carry away contaminants from the to-be-cleaned workpiece.

5. The method according to claim 1, wherein the heating device has an operating temperature of 10 to 30° C.

6. The method according to claim 2, wherein the pressure inside the cleaning chamber is controlled to be −73.3 kPa to −100 Pa.

7. The method according to claim 3, wherein the inert gas is at least one selected from nitrogen and argon.

8. The method according to claim 4, wherein a laminar gas is generated above the to-be-cleaned workpiece for blowing, and the laminar gas is then expelled through a vacuum system.

9. The method according to claim 8, wherein a raw material used to generate a blowing gas is at least one selected from nitrogen and argon.

* * * * *